United States Patent
Farnworth et al.

(10) Patent No.: US 8,115,269 B2
(45) Date of Patent: Feb. 14, 2012

(54) INTEGRATED CIRCUIT PACKAGE HAVING REDUCED INTERCONNECTS

(75) Inventors: Warren M. Farnworth, Nampa, ID (US); Jerry M. Brooks, Caldwell, ID (US)

(73) Assignee: Round Rock Research, LLC, Mt. Kisco, NY (US)

(*) Notice: Subject to any disclaimer, the term of this patent is extended or adjusted under 35 U.S.C. 154(b) by 0 days.

(21) Appl. No.: 12/710,072

(22) Filed: Feb. 22, 2010

(65) Prior Publication Data

US 2010/0148372 A1   Jun. 17, 2010

Related U.S. Application Data

(60) Continuation of application No. 11/218,998, filed on Sep. 1, 2005, now Pat. No. 7,674,652, which is a division of application No. 10/126,067, filed on Apr. 19, 2002, now Pat. No. 6,979,904.

(51) Int. Cl.
    *H01L 31/075* (2006.01)
    *H01L 31/105* (2006.01)
    *H01L 31/117* (2006.01)

(52) U.S. Cl. ......... 257/458; 257/686; 257/777; 438/106

(58) Field of Classification Search .................. None
    See application file for complete search history.

(56) References Cited

U.S. PATENT DOCUMENTS

| | | |
|---|---|---|
| 5,347,428 A | 9/1994 | Carson et al. |
| 5,399,898 A | 3/1995 | Rostoker |
| 5,990,566 A | 11/1999 | Farnworth et al. |
| 6,013,948 A | 1/2000 | Akram et al. |
| 6,020,629 A | 2/2000 | Farnworth et al. |
| 6,072,233 A | 6/2000 | Corisis et al. |
| 6,087,723 A | 7/2000 | Kinsman et al. |
| 6,107,109 A | 8/2000 | Akram et al. |
| 6,157,080 A * | 12/2000 | Tamaki et al. ............... 257/738 |
| 6,191,474 B1 | 2/2001 | Kinsman et al. |
| 6,207,474 B1 | 3/2001 | King et al. |
| 6,210,993 B1 | 4/2001 | Farnworth et al. |
| 6,215,183 B1 | 4/2001 | Kinsman et al. |
| 6,228,677 B1 | 5/2001 | Kinsman et al. |
| 6,229,217 B1 * | 5/2001 | Fukui et al. ................. 257/777 |
| 6,235,554 B1 | 5/2001 | Akram et al. |
| 6,268,649 B1 | 7/2001 | Corisis et al. |
| 6,271,056 B1 | 8/2001 | Farnworth et al. |
| 6,291,894 B1 | 9/2001 | Farnworth et al. |
| 6,297,542 B1 | 10/2001 | Farnworth et al. |
| 6,313,522 B1 | 11/2001 | Akram et al. |
| 6,329,221 B1 | 12/2001 | King et al. |

(Continued)

OTHER PUBLICATIONS

Harper, Charles A.; Electronic Packaging and Interconnection Handbook; 2000, McGraw-Hill, Third Edition, pp. 7.80-7.82.

*Primary Examiner* — Zandra Smith
*Assistant Examiner* — Khanh Duong
(74) *Attorney, Agent, or Firm* — Lerner, David, Littenberg, Krumholz & Mentlik, LLP

(57) ABSTRACT

A technique for making an integrated circuit package. Specifically, a stacked memory device is provided with minimal interconnects. Memory die are stacked on top of each other and electrically coupled to a substrate. Thru vias are provided in the substrate and/or memory die to facilitate the electrical connects without necessitating a complex interconnect technology between each of the interfaces. Wire bonds are used to complete the circuit package.

18 Claims, 2 Drawing Sheets

U.S. PATENT DOCUMENTS

| | | |
|---|---|---|
| 6,329,709 B1 | 12/2001 | Moden et al. |
| 6,329,712 B1 | 12/2001 | Akram et al. |
| 6,331,939 B1 | 12/2001 | Corisis et al. |
| 6,333,555 B1 | 12/2001 | Farnworth et al. |
| 6,333,562 B1 | 12/2001 | Lin |
| 6,342,731 B1 | 1/2002 | Kinsman et al. |
| 6,355,984 B2 | 3/2002 | Miyamoto et al. |
| 6,365,437 B2 | 4/2002 | Farnworth et al. |
| 6,392,292 B1 | 5/2002 | Morishita |
| 6,404,044 B2 | 6/2002 | Akram et al. |
| 6,408,509 B1 | 6/2002 | Kinsman et al. |
| 6,410,406 B1 | 6/2002 | Farnworth et al. |
| 6,414,374 B2 | 7/2002 | Farnworth et al. |
| 6,437,435 B1 | 8/2002 | Kinsman et al. |
| 6,441,496 B1 | 8/2002 | Chen et al. |
| 6,445,063 B1 | 9/2002 | King et al. |
| 6,451,624 B1 | 9/2002 | Farnworth et al. |
| 6,455,351 B2 | 9/2002 | Kinsman et al. |
| 6,455,928 B2 | 9/2002 | Corisis et al. |
| 6,465,275 B2 | 10/2002 | King et al. |
| 6,476,475 B1 | 11/2002 | Lee |
| 6,476,500 B2 | 11/2002 | Kimura |
| 6,518,655 B2 * | 2/2003 | Morinaga et al. ............ 257/678 |
| 6,545,366 B2 * | 4/2003 | Michii et al. .................. 257/777 |
| 6,552,423 B2 | 4/2003 | Song et al. |
| 6,563,206 B2 | 5/2003 | Kamikuri et al. |
| 6,884,658 B2 | 4/2005 | Akram |
| 6,900,528 B2 * | 5/2005 | Mess et al. .................... 257/686 |
| 6,951,774 B2 * | 10/2005 | Nakamura et al. ............ 438/109 |
| 7,042,073 B2 * | 5/2006 | Kado et al. .................... 257/678 |
| 2001/0040281 A1 | 11/2001 | Butler |
| 2002/0105067 A1 | 8/2002 | Oka et al. |
| 2003/0042615 A1 | 3/2003 | Jiang et al. |

* cited by examiner

INTEGRATED CIRCUIT PACKAGE HAVING REDUCED INTERCONNECTS

CROSS-REFERENCE TO RELATED APPLICATIONS

The present application is a continuation of U.S. application Ser. No. 11/218,998, filed Sep. 1, 2005, and issued as U.S. Pat. No. 7,674,652 on Mar. 9, 2010, which is a divisional of U.S. application Ser. No. 10/126,067, which was filed on Apr. 19, 2002, and issued as U.S. Pat. No. 6,979,904 on Dec. 27, 2005.

BACKGROUND OF THE INVENTION

1. Field of the Invention

The present invention relates generally to electrical circuitry and, more particularly, to a technique for packaging electronic devices using a combination wirebond I/O and thru via interconnect process.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Packaging of electrical circuits is a key element in the technological development of any device containing electrical components. Fine-Pitch Surface Mount Technology (FPT) and Pin-Grid Array (PGA) technology are well developed areas of packaging technology. An emerging packaging method has been developed using Ball Grid Array (BGA) technology. BGA packages implement conductive metal, such as solder, which is formed into spheres or balls and disposed on conductive ball pads on a substrate or other surface. The solder balls are generally configured into an array to provide mechanical as well as electrical interfaces between surfaces, such as an integrated circuit die and a substrate, for instance.

BGA technology offers several advantages over FPT and PGA. Among the most often cited advantages of BGA are: reduced co-planarity problems, since there are no leads; reduced placement problems; reduced handling damage; smaller size; better electrical and thermal performance; better package yield; better board assembly yield; higher interconnect density; multi-layer interconnect options; higher I/Os for a given footprint; easier extension to multi-chip modules; and faster design-to-production cycle time. Despite the benefits provided by BGA technology, BGA is still a surface mount technology like FPT and PGA and, thus, is limited by the space available on the mounting surface.

Significant research and development has been devoted to finding ways to provide greater capabilities into smaller areas. One mechanism for increasing the amount of electrical circuitry without increasing the surface mount space necessary to house the components is to stack devices on top of each other. Circuit packages may be mounted one on top of the other using BGA technology. To couple each device to the underlying substrate, ball grid array technology may be used. However, stacking devices generally requires implementing different interconnect technologies to electrically couple die-to-die and die-to-substrate. Increasing the number of surface mount technologies may disadvantageously increase the failure rate of systems and unnecessarily complicate device design.

With die-to-die interconnects, there is less concern regarding mismatched coefficients of thermal expansion (CTE) since the die will expand and contract at a similar rate. Conversely, at the die-to-substrate interconnect there may be a significant CTE mismatch between the silicon die and the substrate material. This problem is often solved by using underfill. However, the process of implementing underfill is relatively expensive and time consuming. Further, die stacking using underfill may add stress to the package.

The present invention may address one or more of the problems set forth above.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
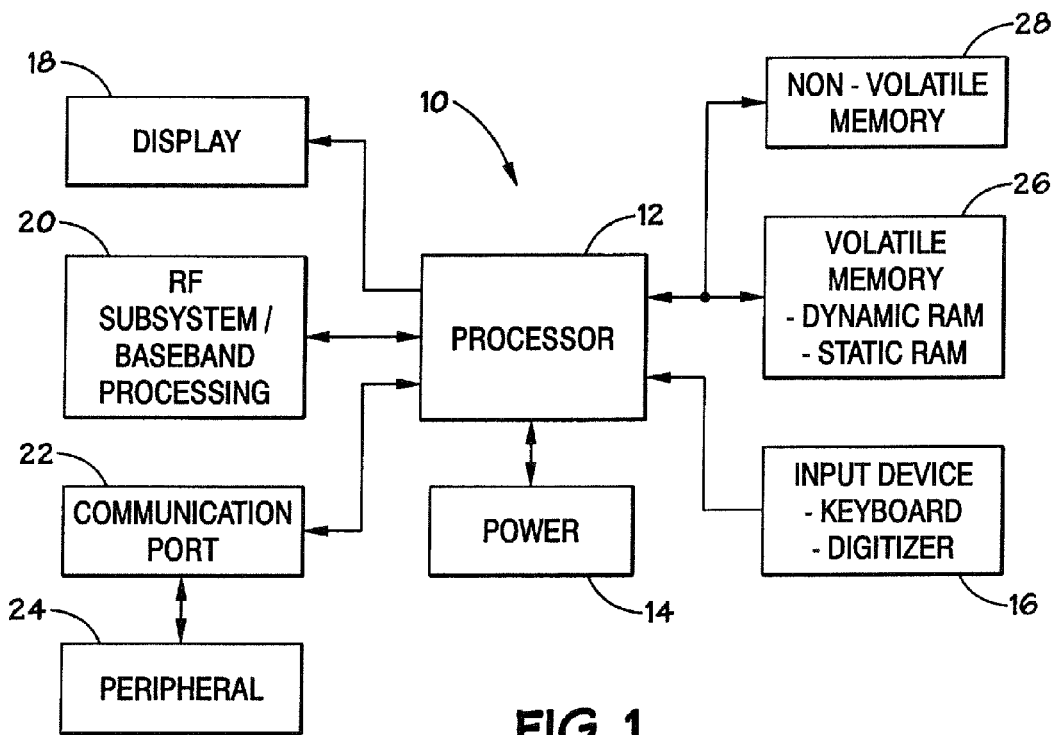
FIG. 1 illustrates a block diagram of an exemplary processor-based device in accordance with the present techniques.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include an input device, such as buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the software program. For instance, the processor 12 may be coupled to volatile memory 26, which may include dynamic random access memory (DRAM), static random access memory (SRAM), Double Data Rate (DDR) memory, etc. The processor 12 may also be coupled to non-volatile memory 28. The non-volatile memory 28 may include a read only memory (ROM), such as an EPROM or Flash Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

Figure 2:
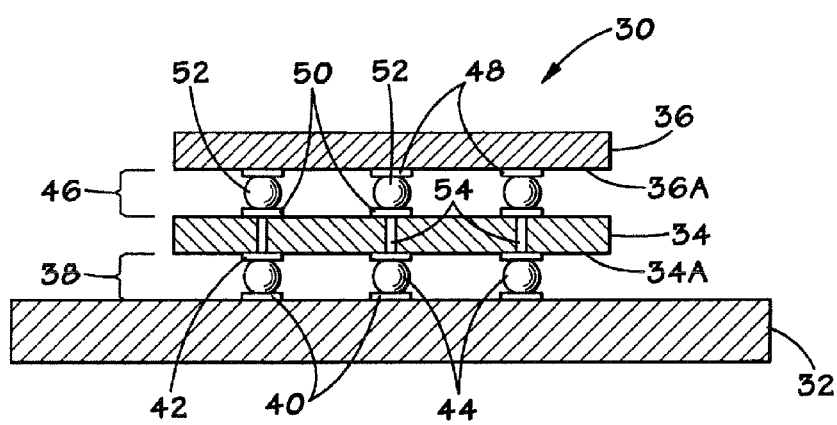
FIG. 2 illustrates a cross sectional view of a conventional stacked memory array.

FIG. 2 illustrates an exemplary conventional circuit package, such as may be used in the device 10 of FIG. 1, designated as reference numeral 30. The circuit package 30 includes a substrate 32 and one or more integrated circuit chips or die mounted vertically with respect to the substrate 32. In this embodiment, chips are memory chips, but other types of die may be used as well. The circuit package 30 includes a first memory die 34 coupled to the substrate 32. A second memory die 36 is stacked on top of the memory die 34 as illustrated. The memory die 34 generally has a circuit side 34A wherein the integrated circuits providing the functionality of the memory die 34 are generally located, along with the bonding pads Likewise, the memory die 36 includes an associated circuit side 36A. The circuit sides 34A and 36A of each memory die 34 and 36 are configured to provide the signals and functionality associated with each respective memory die 34 and 36.

To incorporate each of the memory die 34 and 36 into a system, such as the system 10, each of the memory die 34 and 36 are electrically coupled to the substrate 32 such that data and command signals can be directed to and from each of the memory die 34 and 36 and throughout the system 10. To provide a stacked array, such as is provided by the circuit package 30, interconnects are implemented at each of the circuit interfaces to facilitate the electrical coupling of each of the memory die 34 and 36 to the substrate. A first interconnect 38 provides the interface from the first memory die 34 to the substrate 32. The first interconnect 38 implements BGA technology to electrically couple the memory die 34 to the substrate 32. Typically, ball pads 40 are disposed on the surface of the substrate 32. Similarly, ball pads 42 are disposed on the circuit side 34A of the memory die 34. A conductive metal, such as solder, is disposed between the ball pads 40 and 42 forming a conductive path from the memory die 34 to the substrate 32 through solder balls 44. As can be appreciated by those skilled in the art, the ball pads 40 on the substrate 32 may be coupled to various layers of conductive traces (not shown) through vias in the substrate 32 (not shown) to route signals delivered through the traces to various components throughout the system 10. Likewise, the ball pads 42 may be coupled to the various circuits on the memory die such that signals can be delivered through the ball pads 42 to and from circuits on the memory die 34.

A second interconnect 46 is provided to electrically couple the memory die 36 to the memory die 34. The second interconnect 46 also implements BGA technology to provide the interface between the memory die 36 and the memory die 34. As previously described, the memory die 34 is mounted with the circuit side 34A down. Likewise, the memory die 36 is mounted with the circuit side 36A down. To provide the coupling mechanism to electrically couple the memory die 36 to the memory die 34, ball pads 48 are disposed on the circuit side 36A of the memory die 36. Ball pads 50 are also disposed on the backside of the memory die 34 such that solder balls 52 provide a conductive path from the memory die 36 to the memory die 34. Because the substrate 32 provides conductive paths to route signals to and from the memory devices 34 and 36 to and from other devices and components in the system 10, signals from the memory die 36 are also delivered to the substrate 32 for routing throughout the system 10.

As described above, the second interconnect 46 provides a mechanism for delivering signals from the memory die 36 to the memory die 34. Further, the first interconnect 38 provides a conductive path from the memory die 34 to the substrate 32. Thus, to complete the electrical path from the memory die 36 to the substrate 32, vias 54 are provided through the memory die 34. While the circuit package 30 illustrates a package wherein the first interconnect 38 is directly below the second interconnect 46 and are electrically coupled to one another through a vertically illustrated via 54, it should be understood that conductive traces and varied placement of the associated ball pads 40, 42, 48, and 50 may be implemented.

One of the disadvantages of the design illustrated in FIG. 2 is the implementation of two interconnect layers 38 and 46. The interconnect used to couple the substrate 32 to the memory die 34 (i.e., interconnect 38) may be a different interconnect technology than the techniques used to couple the memory die 34 to the memory die 36 (i.e., interconnect 46). As previously described, with each interconnect layer and each varied technology, more interconnect problems may arise in the forming of the circuit package.

Figure 3:
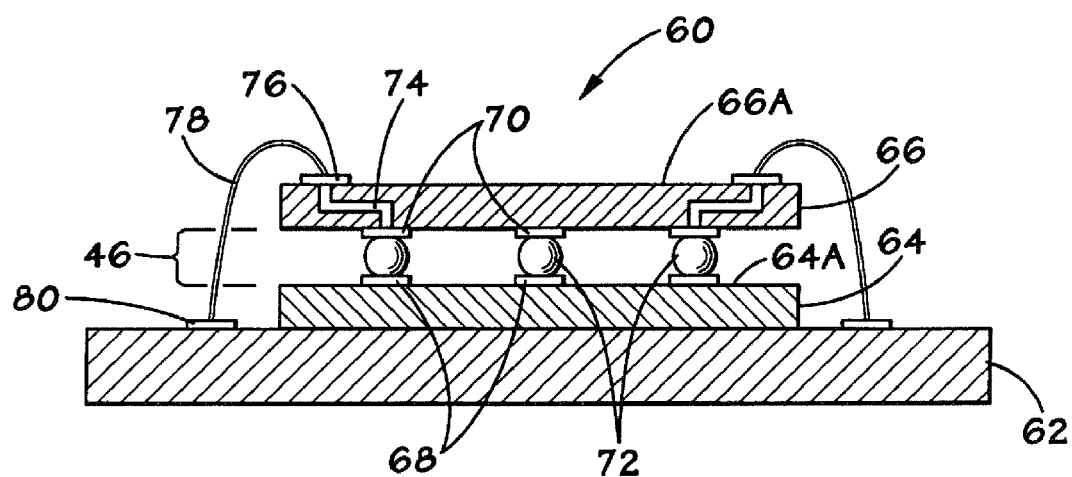
FIG. 3 illustrates a cross sectional view of a stacked memory array in accordance with the present techniques.

FIG. 3 illustrates an exemplary circuit package 60 in accordance with the present techniques. The circuit package 60 comprises a substrate 62 and stacked memory die 64 and 66. Each of the memory die 64 and 66 are mounted onto the substrate 62 circuit side up. The circuit side 64A of the memory die 64 faces away from the substrate 62. Thus, the backside of the memory die 64 can be directly attached to the substrate 62 since the backside of the memory die 64 does not contain integrated circuit components or pads and need not be electrically coupled to the substrate 62. The memory die 64 can be attached to the substrate 62 by any conventional paste or epoxy, for example. Alternatively, the backside of the memory die 64 may include conductive pads which may carry power or ground signals, for example, to the substrate 62. In this alternative embodiment, an electrically conductive film or paste, such as an isotropic (z-axis) conductive paste, may be used.

The circuit side 64A of the memory die 64 includes a plurality of ball pads 68. In the exemplary circuit package 60, the ball pads 68 on the circuit side 64A of the memory die 64 are aligned with ball pads 70 on the backside of the memory die 66. The memory die 64 is electrically coupled to the memory die 66 through conductive balls such as solder balls 72. Signals from the memory die 64 are delivered to the memory die 66 and routed to the circuit side 66A of the memory die 66 through conductive traces 74 in the memory die 66. The conductive traces 74 may include signal paths formed by metal traces. Metal traces on different layers of the substrate may be electrically connected by vias. The signals are directed through the conductive traces 74 to bond pads 76 on the circuit side 66A of the memory die 66. The conductive trace 74, the ball pads 70, and the bond pads 76 may be referred to collectively as "connections." Bondwires 78 may be used to couple the bond pad 76 to bond pads 80 on the substrate 62.

The configuration of the circuit package 60 only utilizes the implementation of a single interconnect 46 between the memory die 64 and the memory die 66. Advantageously, the disadvantages associated with interconnects may be minimized by reducing the number of interconnects in the design of the circuit package 60. As can be seen in FIG. 3, the circuit package 60 provides a mechanism for coupling each of the memory die 64 and 66 to each other and to the substrate 62 while reducing the number of interconnects used to complete the signal routing. As can be appreciated by those skilled in the art, the techniques described herein can be implemented in circuit packages comprising more than two memory die stacked with respect to each other.

Figure 4:
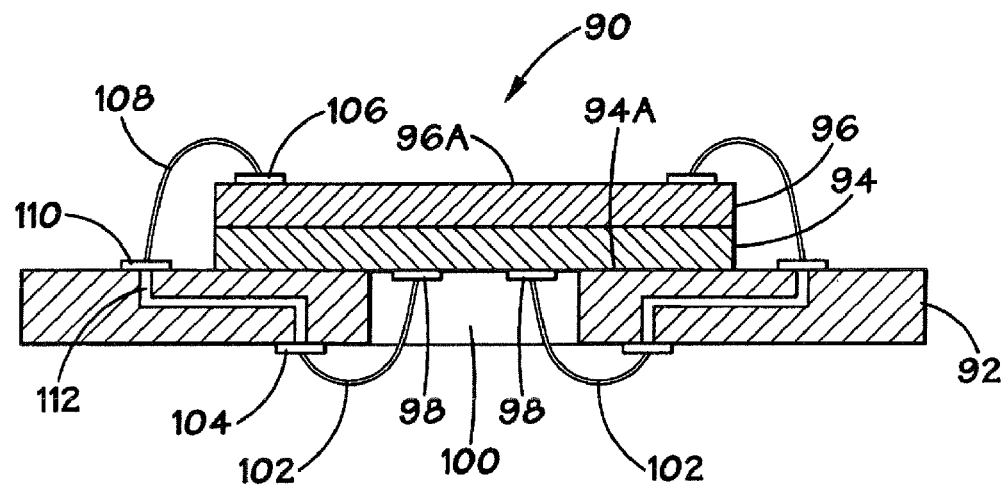
FIG. 4 illustrates a cross sectional view of an alternate embodiment of a stacked memory array in accordance with the present techniques.

FIG. 4 illustrates an alternate embodiment of a circuit package 90 in accordance with the present techniques. The circuit package 90 includes a substrate 92 and memory die 94 and 96. The memory die 94 is mounted with its corresponding circuit side 94A down (or facing the substrate 92). The memory die 94 may be attached to the substrate by paste or epoxy, for example. Signals are routed from the circuit side 94A to the pads 98 on the memory die 94. The pads 98 are configured such that they align with a slot 100 in the substrate 92. The slot 100 provides an opening such that bondwires 102 can be used to electrically couple the memory die 94 to the substrate 92. The bondwires 102 are disposed between the bond pads 98 on the circuit side 94A of the memory die 94 and bond pads 104 on a backside of the substrate 92.

The memory die 96 is mounted such that the circuit side 96A faces away from the substrate 92 (i.e., circuit side up). Thus, any typical epoxy or paste can be used to couple each of the memory die 94 and 96 to each other. The circuit side 96A of the memory die 96 includes bond pads 106. Bondwires 108 may be implemented to electrically couple the memory die 96 to the substrate 92. The bondwires 108 are disposed between the bond pads 106 on the circuit side 96A of the memory die 96 and bond pads 110 on the surface of the substrate 92, as illustrated. Vias and conductive traces 112 in the substrate 92 are implemented to electrically couple the memory die 96 to the memory die 94 in conjunction with the bondwires 102 and 108. The conductive traces 112, bond pads 104 and bond pads 110 may be referred to collectively as "connections." As can be appreciated by those skilled in the art, the presently described circuit package 90 implements a die stacking technique wherein no interconnects between the stacked die are used.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An integrated circuit package comprising:
a substrate having a front side and a backside and having connections extending through the substrate, wherein the connections extending through the substrate include first conductive pads on the backside of the substrate and second conductive pads on the front side of the substrate, wherein the first conductive pads on the backside of the substrate are electrically coupled to the second conductive pads on the front side of the substrate by conductive pathways extending through the substrate;
a first die having a circuit side and a backside, wherein the circuit side has third conductive pads thereon and is adhesively coupled to the substrate, wherein the third conductive pads are coupled to the first conductive pads on the backside of the substrate; and
a second die having a circuit side and a backside and having fourth conductive pads on the circuit side, wherein the backside of the second die is adhesively coupled to the backside of the first die and the fourth conductive pads on the circuit side of the second die are coupled to the second conductive pads on the front side of the substrate.

2. The integrated circuit package, as set forth in claim 1, wherein the first die is a memory die.

3. The integrated circuit package, as set forth in claim 1, wherein the second die is a memory die.

4. The integrated circuit package, as set forth in claim 1, wherein the first conductive pads on the backside of the substrate are coupled to the third conductive pads on the circuit side of the first die via bondwires.

5. The integrated circuit package, as set forth in claim 1, wherein the second conductive pads on the front side of the substrate are coupled to the fourth conductive pads on the circuit side of the second die via bondwires.

6. The integrated circuit package, as set forth in claim 1, wherein the circuit side of the first die is adhesively coupled to the substrate via a non-conductive epoxy.

7. A system comprising:
a processor; and
an integrated circuit package coupled to the processor and comprising:
a substrate having a front side and a backside and having connections extending through the substrate, wherein the connections extending through the substrate include first conductive pads on the backside of the substrate and second conductive pads on the front side of the substrate, wherein the first conductive pads on the backside of the substrate are electrically coupled to the second conductive pads on the front side of the substrate by conductive pathways extending through the substrate;
a first die having a circuit side and a backside, wherein the circuit side has third conductive pads thereon and is adhesively coupled to the substrate, wherein the third conductive pads are coupled to the first conductive pads on the backside of the substrate; and
a second die having a circuit side and a backside and having fourth conductive pads on the circuit side, wherein the backside of the second die is adhesively coupled to the backside of the first die and the fourth conductive pads on the circuit side of the second die are coupled to the third conductive pads on the front side of the substrate.

8. The system, as set forth in claim 7, wherein the first die comprises a memory die.

9. The system, as set forth in claim 7, wherein the second die comprises a memory die.

10. The system, as set forth in claim 7, wherein the first conductive pads on the backside of the substrate are coupled to the third conductive pads on the circuit side of the first die via bondwires.

11. The system, as set forth in claim 7, wherein the second conductive pads on the front side of the substrate are coupled to the fourth conductive pads on the circuit side of the second die via bondwires.

12. The system, as set forth in claim 7, wherein the circuit side of the first die is adhesively coupled to the substrate via a non-conductive epoxy.

13. An integrated circuit package comprising:
   a substrate having a front side having first conductive pads thereon and a backside having second conductive pads thereon, the substrate having a slot therethrough, wherein the first conductive pads on the front side of the substrate are electrically coupled to the second conductive pads on the backside of the substrate by conductive paths extending through the substrate;
   a first die having a circuit side and a backside, wherein the circuit side has third conductive pads thereon and wherein the circuit side is adhesively coupled to the substrate such that the third conductive pads are aligned with the slot in the substrate and wherein the third conductive pads are coupled to the second conductive pads on the backside of the substrate; and
   a second die having a circuit side and a backside and having fourth conductive pads on the circuit side, wherein the backside of the second die is adhesively coupled to the backside of the first die and wherein the fourth conductive pads on the circuit side of the second die are coupled to the first conductive pads on the front side of the substrate.

14. The integrated circuit package, as set forth in claim 13, wherein the first die comprises a memory die.

15. The integrated circuit package, as set forth in claim 13, wherein the second die comprises a memory die.

16. The integrated circuit package, as set forth in claim 13, wherein the circuit side of the first die is adhesively coupled to the substrate via a non-conductive epoxy.

17. The integrated circuit package, as set forth in claim 13, wherein the third conductive pads on the circuit side of the first die are coupled to the second conductive pads on the backside of the substrate via bondwires.

18. The integrated circuit package, as set forth in claim 17, wherein the fourth conductive pads on the circuit side of the second die are coupled to the first conductive pads on the front side of the substrate via bondwires.

* * * * *